(12) United States Patent
Hsiao et al.

(10) Patent No.: US 9,356,125 B1
(45) Date of Patent: May 31, 2016

(54) MANUFACTURING METHOD OF SEMICONDUCTOR STRUCTURE

(71) Applicant: UNITED MICROELECTRONICS CORP., Hsin-Chu (TW)

(72) Inventors: Yu-Tung Hsiao, Tainan (TW); Keng-Jen Lin, Kaohsiung (TW); Yu-Ren Wang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/810,500

(22) Filed: Jul. 28, 2015

(51) Int. Cl.
  *H01L 29/66* (2006.01)
  *H01L 21/02* (2006.01)
  *H01L 21/31* (2006.01)
  *H01L 21/324* (2006.01)
  *H01L 29/06* (2006.01)
  *H01L 21/00* (2006.01)

(52) U.S. Cl.
  CPC .... *H01L 29/66795* (2013.01); *H01L 21/02107* (2013.01); *H01L 21/31* (2013.01); *H01L 21/324* (2013.01); *H01L 29/0653* (2013.01)

(58) Field of Classification Search
  None
  See application file for complete search history.

(56) References Cited

U.S. PATENT DOCUMENTS

| 8,334,197 | B2 * | 12/2012 | Lee | H01L 21/28185 438/591 |
|---|---|---|---|---|
| 8,580,641 | B2 | 11/2013 | Lu | |
| 2004/0092073 | A1 * | 5/2004 | Cabral, Jr. | C23C 16/405 438/287 |
| 2013/0026579 | A1 * | 1/2013 | Lu | H01L 27/1104 257/369 |
| 2014/0252423 | A1 * | 9/2014 | Tsao | H01L 29/66545 257/288 |
| 2014/0363962 | A1 * | 12/2014 | Hou | H01L 29/517 437/591 |
| 2015/0041918 | A1 * | 2/2015 | Wann | H01L 29/66795 257/401 |
| 2015/0072494 | A1 * | 3/2015 | Lin | H01L 29/66795 438/283 |
| 2015/0087144 | A1 * | 3/2015 | Liu | H01L 21/02074 438/595 |
| 2015/0155365 | A1 * | 6/2015 | Lee | H01L 29/4966 257/412 |
| 2015/0228793 | A1 * | 8/2015 | Chen | H01L 29/7851 257/401 |
| 2016/0027639 | A1 * | 1/2016 | Hou | H01L 21/02153 438/653 |
| 2016/0027664 | A1 * | 1/2016 | Ando | H01L 21/32133 438/591 |

* cited by examiner

*Primary Examiner* — Evren Seven
(74) *Attorney, Agent, or Firm* — Winston Hsu; Scott Margo

(57) ABSTRACT

A manufacturing method of a semiconductor structure includes the following steps. A high-k dielectric layer is formed on a semiconductor substrate, and a barrier layer is formed on the high-k dielectric layer. An oxygen annealing treatment is performed after the step of forming the barrier layer; and a capping layer is formed on the barrier layer after the oxygen annealing treatment.

15 Claims, 6 Drawing Sheets

MANUFACTURING METHOD OF SEMICONDUCTOR STRUCTURE

BACKGROUND OF THE INVENTION

1. Field of the Invention

The present invention relates to a manufacturing method of a semiconductor structure, and more particularly, to a manufacturing method of a semiconductor structure with an oxygen annealing treatment on a barrier layer.

2. Description of the Prior Art

In the continuously improved semiconductor integrated circuit technology, the sizes of the semiconductor devices become smaller for increasing the integrity of the integrated circuit. In the scaling down process, the thickness control of layers in the semiconductor device becomes more and more critical. For improving the metal-oxide-semiconductor field effect transistor (MOSFET) device performance as feature sizes continue to decrease, the traditional gate oxide and polysilicon gate electrode are replaced by a high dielectric constant (high-k) gate dielectric and a metal gate electrode. In high-k gate stacks, the interfacial layer (IL) underlying the high-k dielectric layer plays a critical role in the performance of the. However, the thickness and the quality of the IL may be influenced by subsequent thermal processes, and the performance of the MOSFET device will be affected accordingly.

For keeping the qualities of the high-k dielectric layer and the IL from being influenced by the subsequent thermal processes, a capping layer may be formed to cover the IL, the high-k dielectric layer, and a barrier layer on the high-k dielectric layer. The capping layer has to be removed before the step of forming the metal gate, and the residual capping layer will seriously influence the performance and the function of the MOSFET device.

SUMMARY OF THE INVENTION

It is one of the objectives of the present invention to provide a manufacturing method of a semiconductor structure. In the manufacturing method, an oxygen annealing treatment is performed before a step of forming a capping layer so as to improve gain size uniformity of the capping layer, and the residual capping layer issue may be improved accordingly. The oxygen annealing treatment may also be used to form an interfacial layer between a high-k dielectric layer and a semiconductor substrate when the high-k dielectric layer is directly formed on the semiconductor substrate. The thickness of the interfacial layer may be well-controlled accordingly.

A manufacturing method of a semiconductor structure is provided in an embodiment of the present invention. The manufacturing method includes the following steps. A semiconductor substrate is provided. A high-k dielectric layer is formed on the semiconductor substrate. A barrier layer is formed on the high-k dielectric layer. An oxygen annealing treatment is performed after the step of forming the barrier layer. A capping layer is formed on the barrier layer after the oxygen annealing treatment.

A manufacturing method of a semiconductor structure is provided in another embodiment of the present invention. The manufacturing method includes the following steps. A semiconductor substrate is provided. A high-k dielectric layer is formed on the semiconductor substrate. The high-k dielectric layer contacts and is directly formed on a surface of the semiconductor substrate. A barrier layer is formed on the high-k dielectric layer. An oxygen annealing treatment is performed after the step of forming the barrier layer so as to form an interfacial layer between the semiconductor substrate and the high-k dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating the manufacturing method of the semiconductor structure according to the first embodiment of the present invention, wherein FIG. 3 is a cross-sectional drawing taken along a line A-A' in FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIG. 9 and FIG. 10 are schematic drawings illustrating a manufacturing method of a semiconductor structure according to a second embodiment of the present invention, wherein FIG. 10 is a schematic drawing in a step subsequent to FIG. 9.

DETAILED DESCRIPTION

Figure 1:
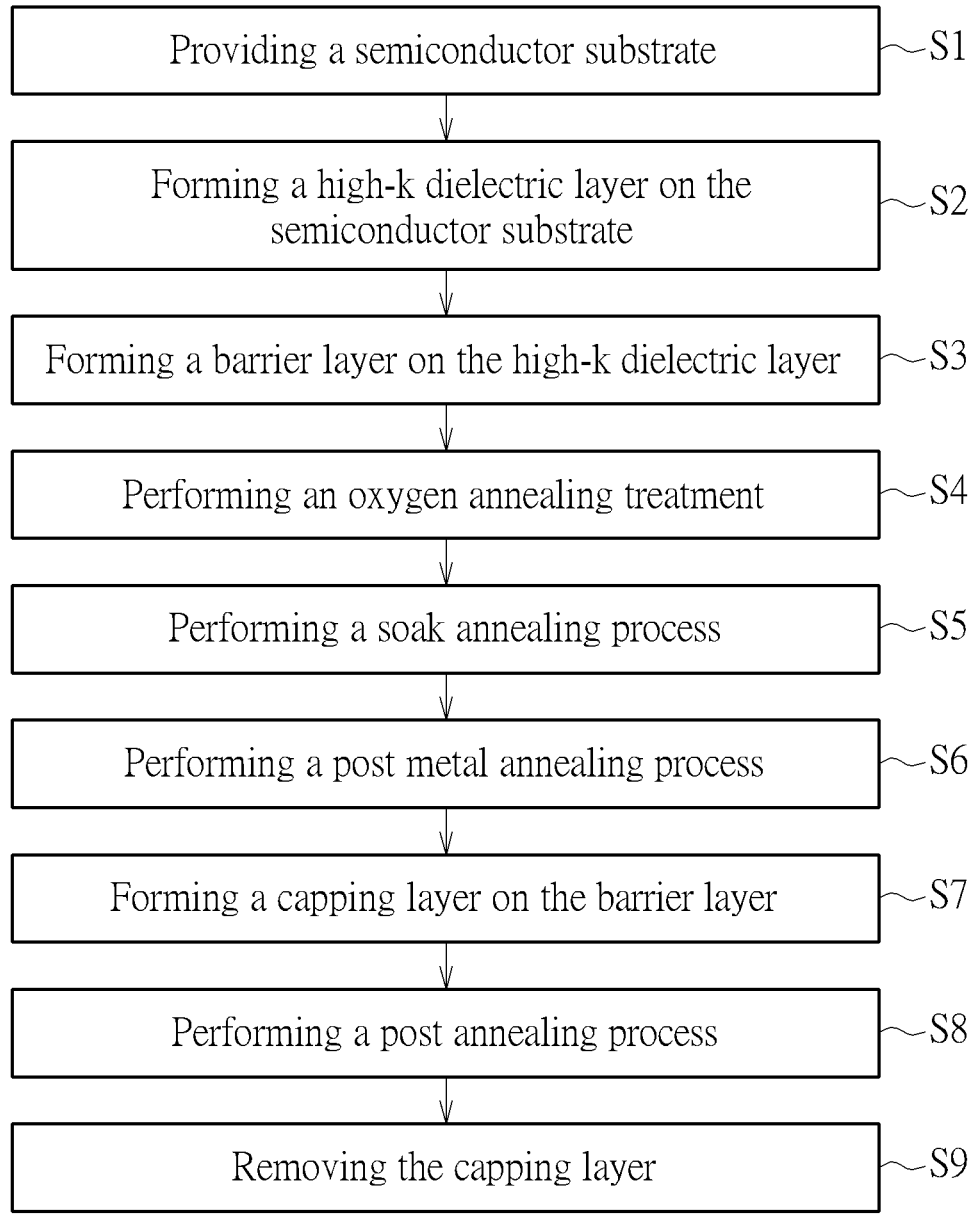
FIG. 1 is a flow chart of a manufacturing method of a semiconductor structure according to a first embodiment of the present invention.
Figure 2:
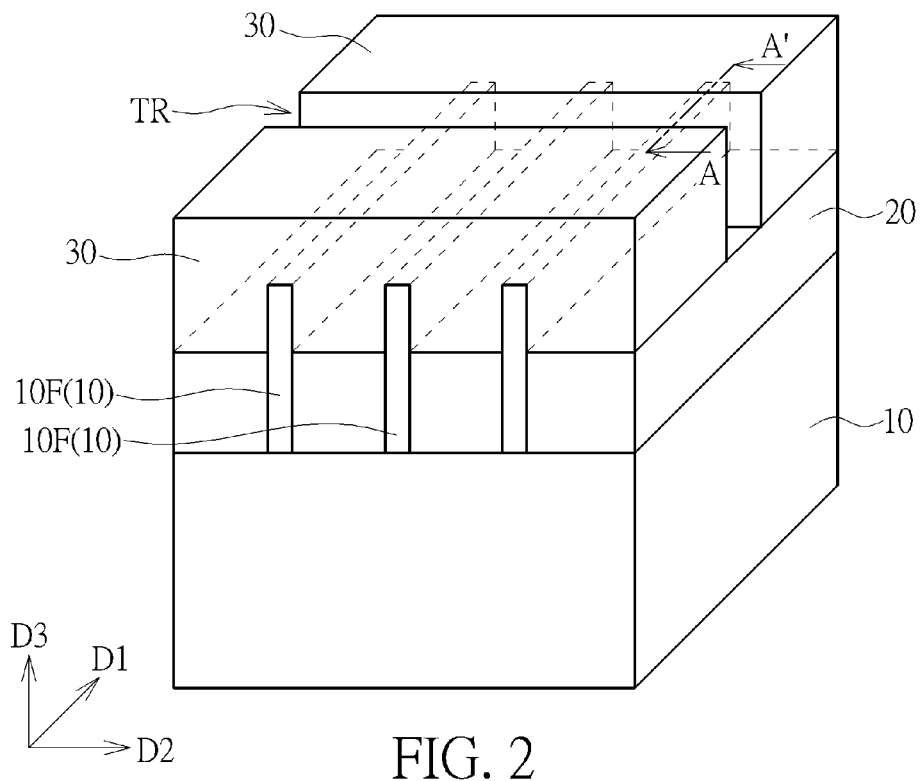
Figure 3:
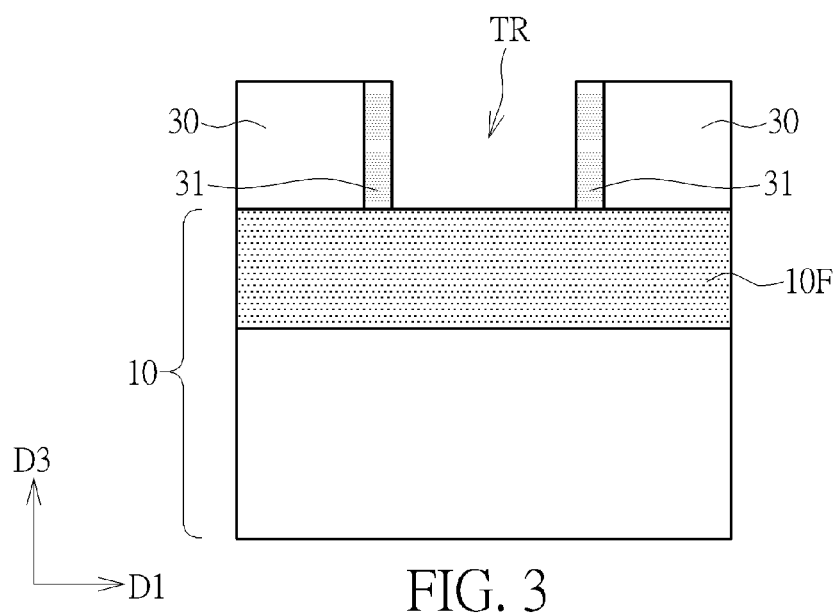

Please refer to FIGS. 1-8. FIG. 1 is a flow chart of a manufacturing method of a semiconductor structure according to a first embodiment of the present invention. FIGS. 2-8 are schematic drawings illustrating the manufacturing method of the semiconductor structure in this embodiment. As shown in FIGS. 1-3, in step S1, a semiconductor substrate 10 is provided. The semiconductor substrate 10 may include a silicon substrate, an epitaxial silicon substrate, a silicon germanium substrate, a silicon carbide substrate, or a silicon-on-insulator (SOI) substrate, but not limited thereto. In this embodiment, the semiconductor substrate 100 may include a plurality of fins 10F protruding in a vertical direction D3 and extending in a first direction D1, and a shallow trench isolation (STI) 20 may be formed between the fins 10F, but not limited thereto. Additionally, in the manufacturing method of this embodiment, for a replacement metal gate (RMG) process, an interlayer dielectric (ILD) 30 may be formed on the semiconductor substrate 10, and at least one trench TR may be formed in the interlayer dielectric 30 and penetrate the interlayer dielectric 30 by removing a dummy gate (not shown) between sidewall spacers 31, but not limited thereto. The trench TR may extend in a second direction D2 perpendicular to the first direction D1, but not limited thereto. The interlayer dielectric 30 covers the fins 10F, and the trench TR exposes a part of the fins 10F. Other features such as lightly doped source/drain regions, source/drain regions, contact etching stop layer (CESL), and silicide features may be selectively formed before the step of forming the interlayer dielectric 30.

Figure 4:
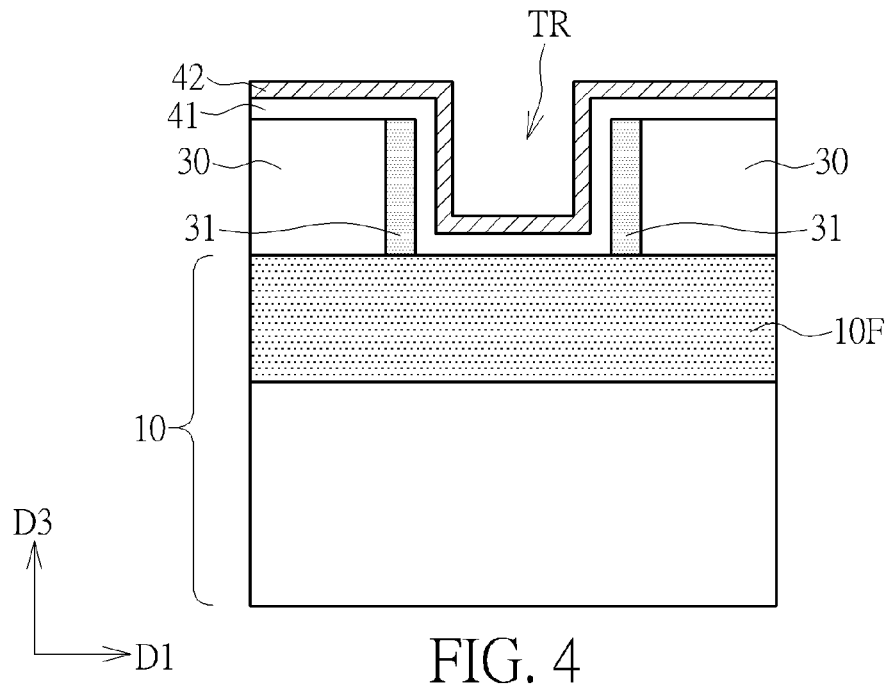

As shown in FIG. 1 and FIG. 4, in step S2, a high-k dielectric layer 41 is formed on the semiconductor substrate 10, and in step S3, a barrier layer 42 is then formed on the high-k dielectric layer 41. The high-k dielectric layer 41 may include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The barrier layer 42 may include titanium nitride (TiN), tantalum nitride (TaN), Ti/TiN multiple layers, or other suitable barrier materials. The high-k dielectric layer 41 and the barrier layer 42 may be formed by chemical vapor deposition (CVD), atomic layer deposition (ALD), physical vapor deposition (PVD), metal organic CVD (MOCVD), plasma enhanced CVD (PECVD), or other suitable technique. In this embodiment, at least a part of the high-k dielectric layer 41 and at least a part of the barrier layer 42 are formed in the trench TR, and at least a part of the high-k dielectric layer 41 and at least a part of the barrier layer 42 are formed on the fin 10F. Specifically, the high-k dielectric layer 41 in this embodiment is directly formed on a surface of the semiconductor substrate 10, and the high-k dielectric layer 41 directly contacts the surface of the semiconductor substrate 10 preferably. In other words, the high-k dielectric layer 41 directly contacts the surface of the fin 10F in this embodiment.

Figure 5:
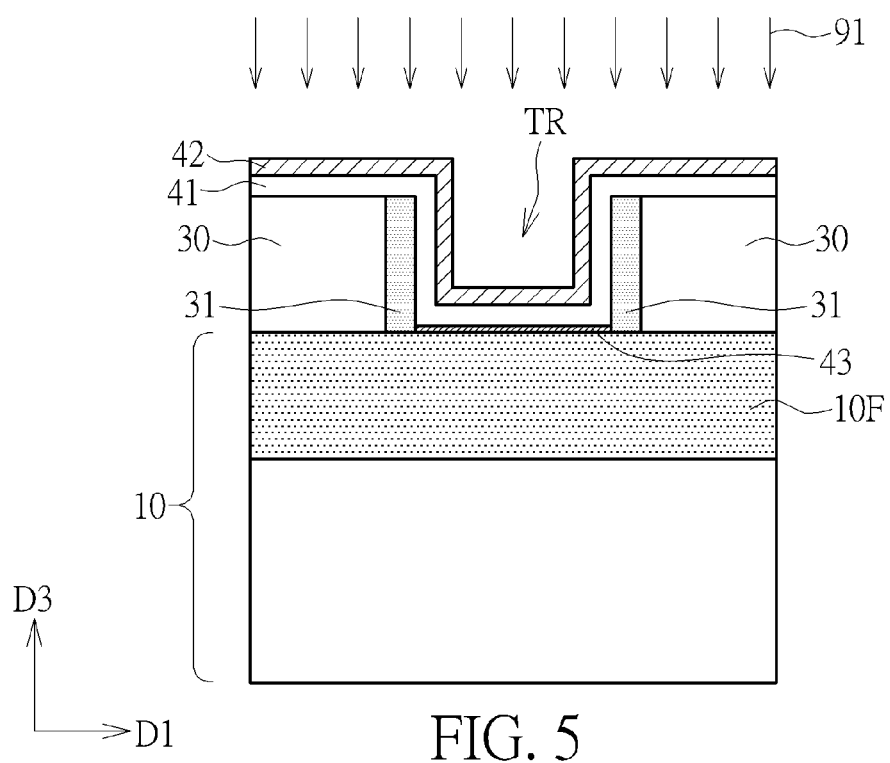

As shown in FIG. 1 and FIG. 5, in step S4, an oxygen annealing treatment 91 is performed on the barrier layer 42 after the step S3 of forming the barrier layer 42. The oxygen annealing treatment 91 may include an oxygen spike annealing or other suitable oxygen annealing approaches. The oxygen spike annealing may be performed at a temperature ranging between 700° C. and 900° C., and the processing time is extremely short (about several milliseconds). In this embodiment, an interfacial layer 43 may then be formed between the high-k dielectric layer 41 and the fin 10F (a part of the semiconductor substrate 10) by the oxygen annealing treatment 91 because oxygen may diffuse toward the interface between the high-k dielectric layer 41 and the semiconductor substrate 10 during the oxygen annealing treatment 91, and the interfacial layer 43 may then be formed under the high temperature condition of the oxygen annealing treatment 91. Therefore, the interfacial layer 43 may be a silicon oxide layer, but not limited thereto. In addition, the oxygen annealing treatment 91 may also be used to modify a surface of the barrier layer 42, and a deposition condition of a capping layer (not shown in FIG. 4) subsequently formed may be improved accordingly.

Figure 6:
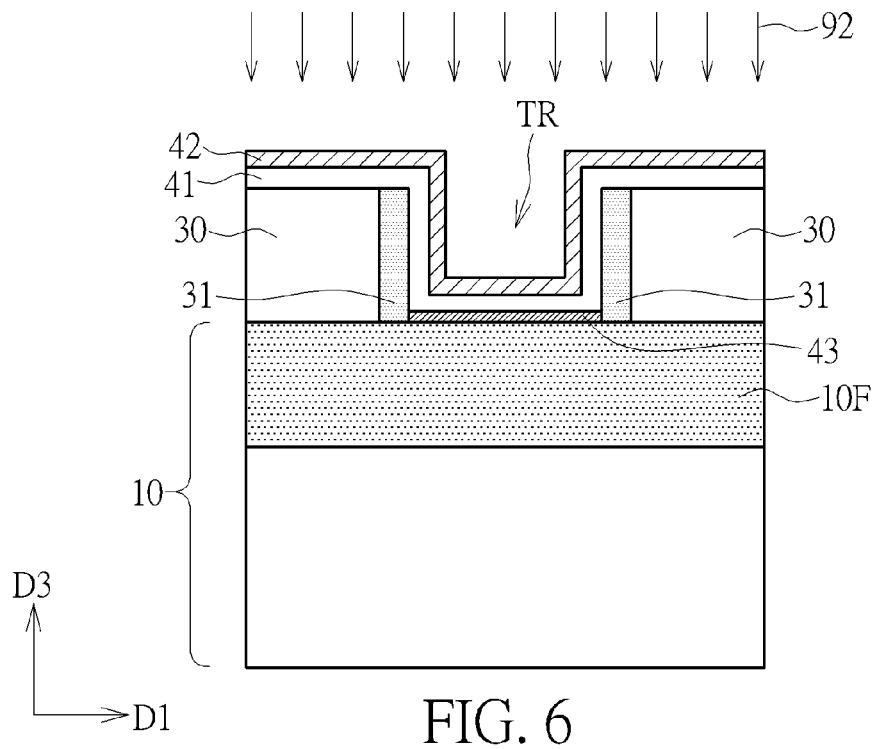

As shown in FIG. 1 and FIG. 6, an annealing process 92 is performed after the oxygen annealing treatment. Specifically, in step S5, a soak annealing process is performed after the oxygen annealing treatment, and in step S6, a post metal annealing process is performed after the soak annealing process. In other words, the annealing process 92 may include the soak annealing process and the post metal annealing process in sequence, and the soak annealing process is performed before the post metal annealing process. The soak annealing process and the post metal annealing process may be used to modify the quality of the high-k dielectric layer 41 and/or the barrier layer 42, and passible damages in the high-k dielectric layer 41 and/or the barrier layer 42 made by the oxygen annealing treatment may also be compensated by the soak annealing process. Therefore, the soak annealing process and the post metal annealing process are performed after the oxygen annealing treatment preferably. For example, the soak annealing process may be performed in an ammonia ($NH_3$) ambience at a temperature around 650° C. for 30 seconds, and the post metal annealing process may be a nitrogen spike annealing at a temperature around 900° C., but not limited thereto. In other words, the temperature of the oxygen annealing treatment is higher than that of the soak annealing process, the temperature of the post metal annealing process is higher than that of the soak annealing process, and the soak annealing process is performed before the post metal annealing process preferably, but not limited thereto. It is worth noting that the oxygen annealing treatment, the soak annealing treatment and the post metal annealing process mentioned above may be performed in an identical chamber without breaking a vacuum condition preferably, so as to simplify the processes and reduce other influences during transportation between different process chambers.

Figure 7:
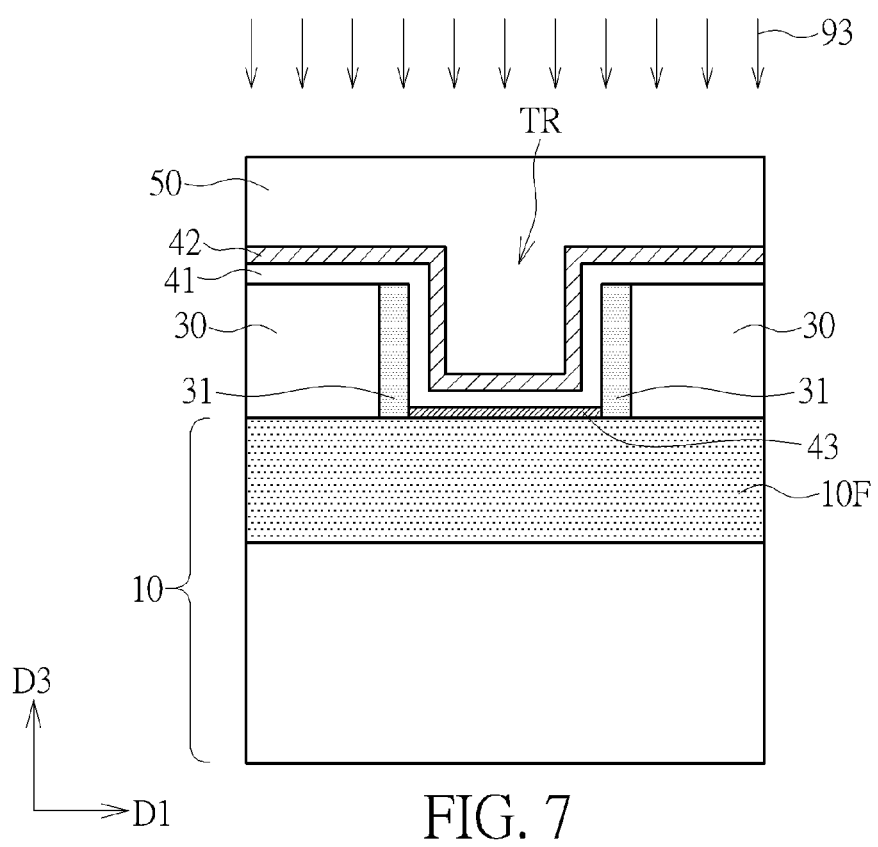

As shown in FIG. 1 and FIG. 7, in step S7, a capping layer 50 is then formed on the barrier layer 42. The capping layer 50 is formed after the oxygen annealing treatment, the soak annealing process, and the post metal annealing process mentioned above. In other words, the oxygen annealing treatment, the soak annealing process, and the post metal annealing process are performed before the step of forming the capping layer 50. Subsequently, in step S8, a post annealing process 93 is performed after the step of forming the capping layer 50. The post annealing process 93 may include a rapid thermal annealing (RTA), a flash annealing, or a laser annealing. The post annealing process 93 may be used to repair defects and improve an interface condition between the barrier layer 42 and the high-k dielectric layer 41 and/or an interface condition between the high-k dielectric layer 41 and the interfacial layer 43. The capping layer 50 may be used to prevent further growth of the interfacial layer 43 and degradation of the high-k dielectric layer 41 and/or the barrier layer 42 during the post annealing process 93. The capping layer 50 may be an amorphous silicon layer formed at a relatively lower temperature preferably, so as to minimize the thermal influence generated by the step of forming the capping layer 50, but not limited thereto. In other embodiments of the present invention, other suitable materials may also be applied to form the capping layer 50. Additionally, the trench TR may be filled with the capping layer 50, or the capping layer may be conformally formed on the barrier layer 42 in other embodiments of the present invention.

Figure 8:
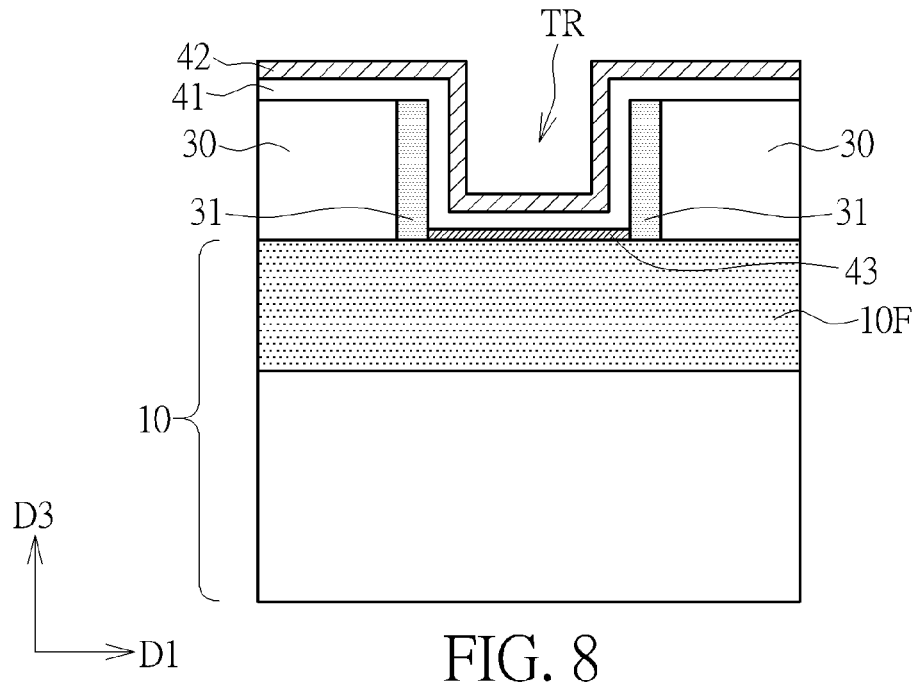

As shown in FIG. 1, FIG. 7, and FIG. 8, in step S9, the capping layer 50 is then removed after the post annealing process 93. When the capping layer 50 is an amorphous silicon layer, the grain size distribution of the deposited capping layer 50 will influence the process of removing the capping layer 50. In other words, if the grain size uniformity is relatively worse, there may be some amorphous silicon residue remaining on the surface of the barrier layer 42 after the process of removing the capping layer 50. However, the oxygen annealing treatment mentioned above may be used to modify the surface condition of the barrier layer 42 and improve the grain size uniformity of the capping layer 50 subsequently formed on the barrier layer 42. The residue problem of the capping layer 50 may be improved by the oxygen annealing treatment on the barrier layer 50. As shown in FIG. 8, after the step of removing the capping layer, a metal conductive material (not shown) may be formed in the trench TR so as to form a metal gate structure. The metal conductive material may include a work function metal layer, a top barrier metal layer, and a low resistance metal, but not limited thereto.

In this embodiment, the oxygen annealing treatment performed after the step of forming the barrier layer 42 may be used to improve the residue problem of the capping layer and to form the interfacial layer 43 between the high-k dielectric layer 41 and the semiconductor substrate 10. The interfacial layer 43 may be formed after the steps of forming the high-k dielectric layer 41 and the barrier layer 42, and the interfacial layer 43 will not be too thick after the oxygen annealing treatment, the soak annealing treatment, and the post metal annealing process accordingly. The process yield and the device performance may be enhanced by the oxygen annealing treatment in this embodiment.

Figure 9:
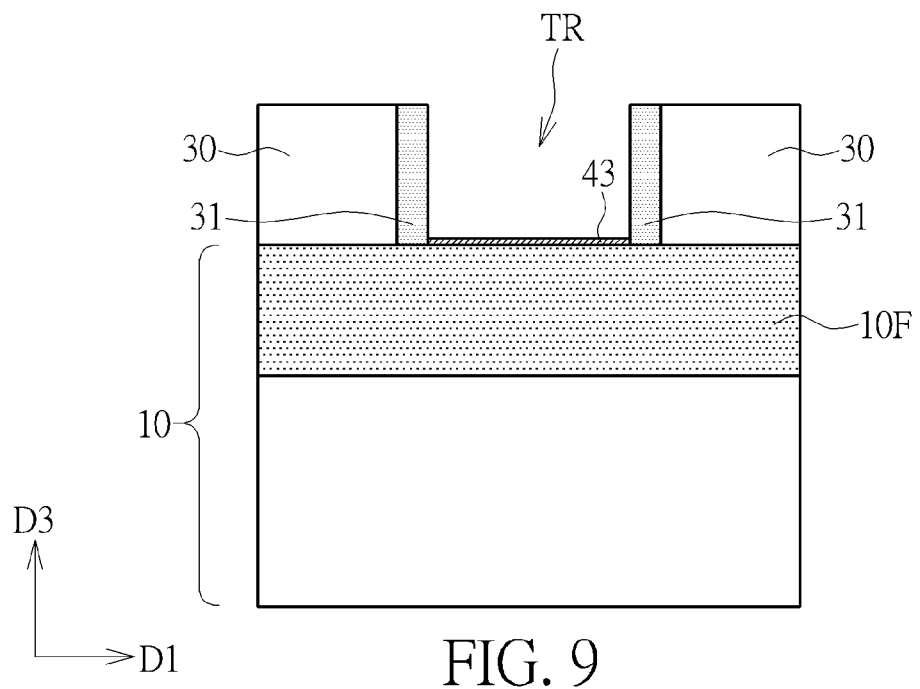
Figure 10:
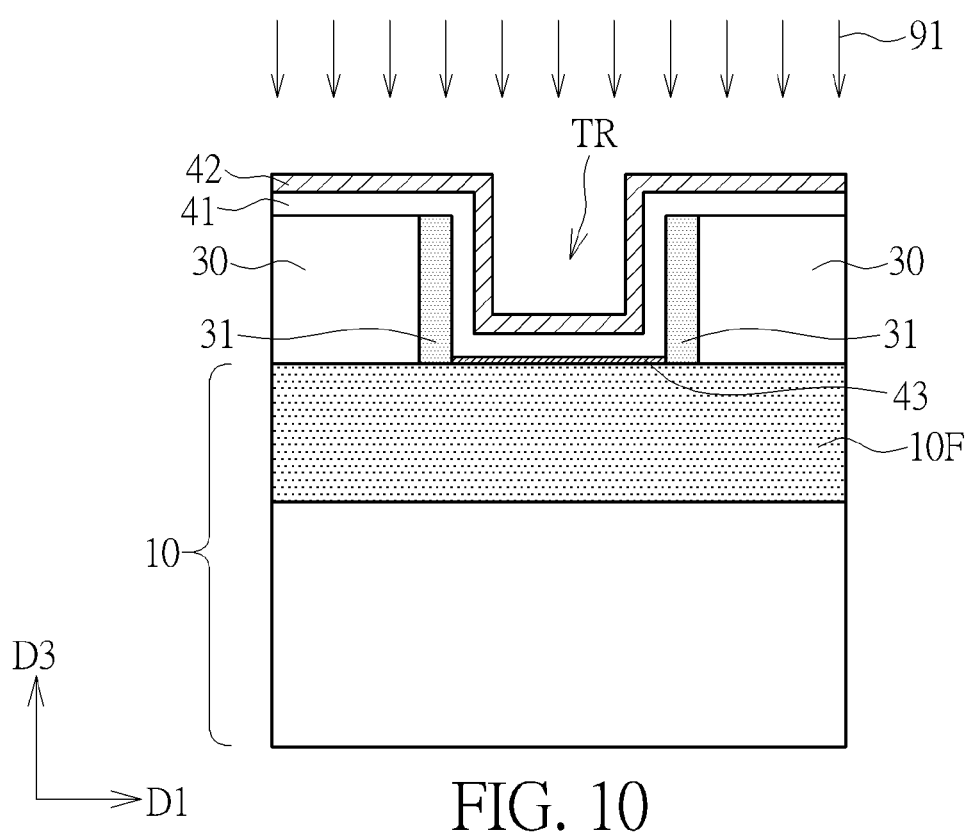

Please refer to FIG. 9, FIG. 10, and FIGS. 6-8. FIG. 9 and FIG. 10 are schematic drawings illustrating a manufacturing method of a semiconductor structure according to a second embodiment of the present invention, wherein FIG. 10 is a schematic drawing in a step subsequent to FIG. 9. FIG. 6 may also be regarded as a schematic drawing in a step subsequent to FIG. 10. As shown in FIG. 9 and FIG. 10, the difference between the manufacturing method in this embodiment and the manufacturing method in the first embodiment is that the interfacial layer 43 is formed on the semiconductor substrate 10 before the step of forming the high-k dielectric layer 41, and at least a part of the high-k dielectric layer 41 is formed on the interfacial layer 43. The interfacial layer 43 in this embodiment may be a chemical oxide interfacial layer thinner than about 1 nanometer preferably, but not limited thereto. The interfacial layer 43 is formed in the trench TR, and the high-k dielectric layer 41 is formed on the interfacial layer 43. As shown in FIG. 10 and FIGS. 6-8, the oxygen annealing treatment 91 is also performed after the step of forming the barrier layer 42 and before the soak annealing treatment and the post metal annealing process. The oxygen annealing treatment 91 in this embodiment may also be used to modify the surface condition of the barrier layer 42 and improve the grain size uniformity of the capping layer 50 subsequently formed on the barrier layer 42.

To summarize the above descriptions, according to the manufacturing method of the semiconductor structure in the present invention, the oxygen annealing treatment performed after the step of forming the barrier layer and before the step of forming the capping layer may be used to improve the residue problem of the capping layer after the step of removing the capping layer. In addition, the oxygen annealing treatment may also be used to form the interfacial layer between the high-k dielectric layer and the semiconductor substrate. The interfacial layer may be formed after the steps of forming the high-k dielectric layer and the barrier layer, and the interfacial layer will not be too thick after the oxygen annealing treatment, the soak annealing treatment, and the post metal annealing process accordingly. The process yield and the device performance may be enhanced by the oxygen annealing treatment in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
    providing a semiconductor substrate;
    forming a high-k dielectric layer on the semiconductor substrate;
    forming a barrier layer on the high-k dielectric layer;
    performing an oxygen annealing treatment after the step of forming the barrier layer;
    performing a soak annealing process after the oxygen annealing treatment; and
    forming a capping layer on the barrier layer after the soak annealing process.

2. The manufacturing method of claim 1, wherein the high-k dielectric layer is directly formed on a surface of the semiconductor substrate, and an interfacial layer is then formed between the high-k dielectric layer and the semiconductor substrate by the oxygen annealing treatment.

3. The manufacturing method of claim 1, further comprising:
    forming an interfacial layer on the semiconductor substrate before the step of forming the high-k dielectric layer, wherein at least a part of the high-k dielectric layer is formed on the interfacial layer.

4. The manufacturing method of claim 1, wherein the oxygen annealing treatment comprises an oxygen spike annealing.

5. The manufacturing method of claim 1, further comprising:
    performing a post metal annealing process after the soak annealing process and before the step of forming the capping layer.

6. The manufacturing method of claim 5, wherein the oxygen annealing treatment, the soak annealing treatment and the post metal annealing process are performed in an identical chamber without breaking a vacuum condition.

7. The manufacturing method of claim 1, further comprising:
    forming an interlayer dielectric on the semiconductor substrate and at least one trench penetrating the interlayer dielectric before the step of forming the high-k dielectric layer, wherein at least a part of the high-k dielectric layer and at least a part of the barrier layer are formed in the trench.

8. The manufacturing method of claim 7, wherein the semiconductor substrate comprises at least one fin, and at least a part of the high-k dielectric layer and at least a part of the barrier layer are formed on the fin.

9. The manufacturing method of claim 1, further comprising:
    performing a post annealing process after the step of forming the capping layer; and
    removing the capping layer after the post annealing process.

10. A manufacturing method of a semiconductor structure, comprising:
    providing a semiconductor substrate;
    forming a high-k dielectric layer on the semiconductor substrate, wherein the high-k dielectric layer contacts and is directly formed on a surface of the semiconductor substrate;
    forming a barrier layer on the high-k dielectric layer;
    performing an oxygen annealing treatment after the step of forming the barrier layer so as to form an interfacial layer between the semiconductor substrate and the high-k dielectric layer; and
    performing a soak annealing process after the oxygen annealing treatment.

11. The manufacturing method of claim 10, further comprising:
    forming a capping layer on the barrier layer after the oxygen annealing treatment;
    performing a post annealing process after the step of forming the capping layer; and
    removing the capping layer after the post annealing process.

12. The manufacturing method of claim 11, further comprising:

performing the soak annealing process after the oxygen annealing treatment and before the step of forming the capping layer.

13. The manufacturing method of claim 12, further comprising:
performing a post metal annealing process after the soak annealing process and before the step of forming the capping layer.

14. The manufacturing method of claim 13, wherein the oxygen annealing treatment, the soak annealing treatment and the post metal annealing process are performed in an identical chamber without breaking a vacuum condition.

15. The manufacturing method of claim 10, wherein the oxygen annealing treatment comprises an oxygen spike annealing.

* * * * *